(12) United States Patent
Kawai (10) Patent No.: US 11,582,891 B2
(45) Date of Patent: Feb. 14, 2023

(54) COMPONENT MOUNTING SYSTEM (71) Applicant: FUJI CORPORATION, Chiryu (JP)

(72) Inventor: Hidetoshi Kawai, Anjo (JP)

(73) Assignee: FUJI CORPORATION, Chiryu (JP)

( * ) Notice: Subject to any disclaimer, the term of this patent is extended or adjusted under 35 U.S.C. 154(b) by 103 days.

(21) Appl. No.: 17/259,742

(22) PCT Filed: Jul. 19, 2018

(86) PCT No.: PCT/JP2018/027069
§ 371 (c)(1),
(2) Date: May 28, 2021

(87) PCT Pub. No.: WO2020/016987
PCT Pub. Date: Jan. 23, 2020

(65) Prior Publication Data
US 2021/0289679 A1    Sep. 16, 2021

(51) Int. Cl.
*B23P 19/00* (2006.01)
*H05K 13/02* (2006.01)

(52) U.S. Cl.
CPC .................. *H05K 13/021* (2013.01)

(58) Field of Classification Search
CPC ........... H05K 13/0417; H05K 13/0857; H05K 13/021
See application file for complete search history.

(56) References Cited

U.S. PATENT DOCUMENTS 10,925,200 B2 * 2/2021 Iisaka ................ H05K 13/0452
2021/0227731 A1 * 7/2021 Oyama ............... H05K 13/085

FOREIGN PATENT DOCUMENTS

WO    WO 2014/118995 A1    8/2014
WO    WO 2017/033268 A1    3/2017

OTHER PUBLICATIONS

International Search Report dated Sep. 25, 2018 in PCT/JP2018/027069 filed Jul. 19,2018, citing document AP therein, 2 pages

* cited by examiner

*Primary Examiner* — Paul D Kim
(74) *Attorney, Agent, or Firm* — Oblon, McClelland, Maier & Neustadt, L.L.P.

(57) ABSTRACT

A component mounting system that includes a component mounter in which multiple component supply units are detachably arranged in a supply area and mounts components on a board based on a job. The system performs a preparatory arrangement control for dividing the component supply units required for the job into multiple, and controlling the unit exchange device to make an arrangement of the component supply units in each group match an arrangement order in the supply area, and a supply arrangement control for controlling the unit exchange device to automatically exchange the component supply units, and to arrange the component supply units required for the job after switching in the supply area.

5 Claims, 12 Drawing Sheets

COMPONENT MOUNTING SYSTEM

TECHNICAL FIELD

The present specification discloses a component mounting system.

BACKGROUND ART

Conventionally, in a component mounting system including a component mounter on which a cassette-type component supply unit (feeder) for supplying components is detachably mounted, a system including an exchange device for automatically exchanging the component supply unit has been proposed (for example, refer to Patent Literature 1). In this system, an exchange timing of each component supply unit is set based on a production plan of boards and a remaining amount of components in each component supply unit, and the exchange device is controlled such that the component supply unit can be attached and detached so as to be automatically exchanged at that exchange timing.

PATENT LITERATURE

Patent Literature 1: WO2017/33268A1

BRIEF SUMMARY

Technical Problem

In the component mounting system described above, at one exchange timing, it takes time to exchange when the number of target component supply units for the automatic exchange increases. In that case, the start of the mounting process is delayed, which leads to a decrease in the production efficiency of the entire system.

The main object of the present disclosure is to efficiently perform the automatic exchange and shorten the exchange time in performing the automatic exchange of the component supply units.

Solution to Problem

The present disclosure has taken following means to achieve the main object described above.

A component mounting system according to the present disclosure includes a component mounter in which multiple component supply units are detachably arranged in a supply area and mounts components on a board based on a job. The system includes: a unit exchange device configured to be able to automatically exchange the component supply unit with a predetermined number as an upper limit for each exchange operation between the unit exchange device and the supply area and between the unit exchange device and a preparation area different from the supply area; and a control device configured to perform a preparatory arrangement control for dividing the component supply units required for the job into multiple groups in a unit with a priority of the predetermined number, and controlling the unit exchange device so as to make an arrangement of the component supply units in each group match an arrangement order in the supply area and to collectively arrange the component supply units in the preparation area for each group, and a supply arrangement control for controlling the unit exchange device so as to automatically exchange the component supply units arranged in the preparation area by the preparatory arrangement control and the component supply units already arranged in the supply area before switching the job in a unit with a priority of the predetermined number at the time of switching the job, and to arrange the component supply units required for the job after switching in the supply area.

The component mounting system in the present disclosure performs a preparatory arrangement control for dividing the component supply units required for the job into multiple groups in a unit with a priority of the predetermined number, and controlling the unit exchange device so as to make the arrangement of the component supply units in each group match the arrangement order in the supply area and to collectively arrange the component supply units in the preparation area for each group. In addition, the component mounting system in the present disclosure performs a supply arrangement control for controlling the unit exchange device so as to automatically exchange the component supply units arranged in the preparation area by the preparatory arrangement control and the component supply units already arranged in the supply area in a unit with a priority of the predetermined number at the time of switching the job, and to arrange the component supply units required for the job after switching in the supply area. Since the unit of predetermined number is the upper limit of one exchange operation by the unit exchange device, the component supply units can be efficiently and automatically exchanged between the preparation area and the supply area. Therefore, in the system in which the component supply units are automatically exchanged, it is possible to shorten the exchange time.

DESCRIPTION OF EMBODIMENTS

Next, an embodiment for the present disclosure will be described with reference to the drawings.

Figure 1:
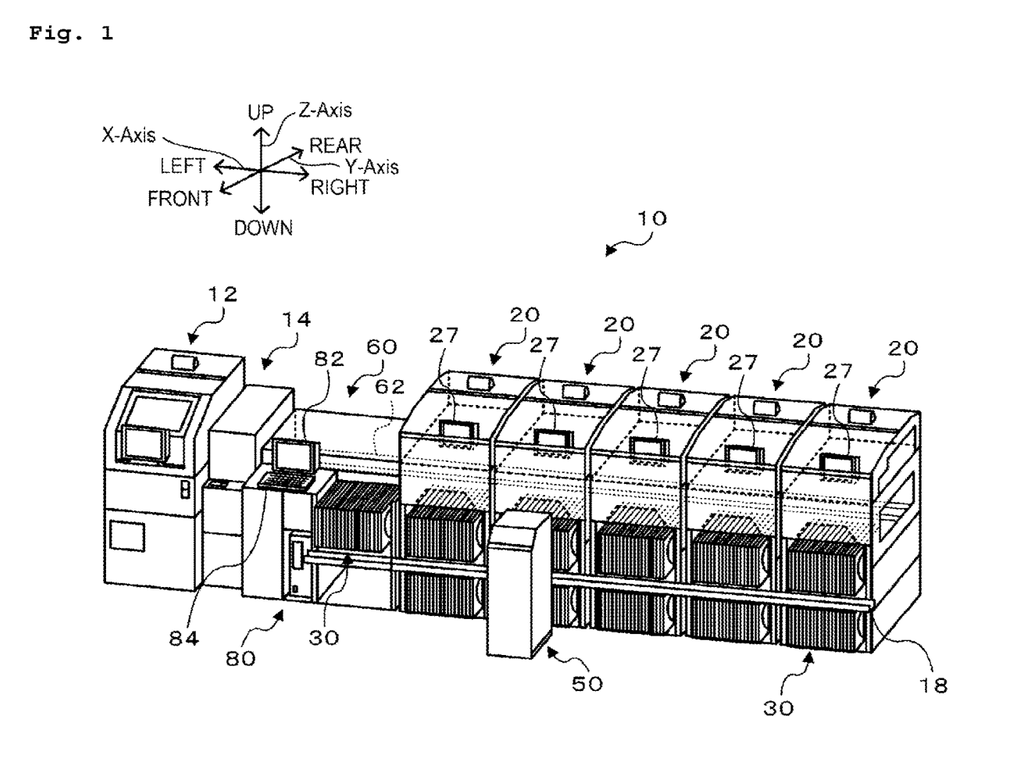
FIG. 1 is a configuration view illustrating an outline of a configuration of component mounting system 10.
Figure 2:
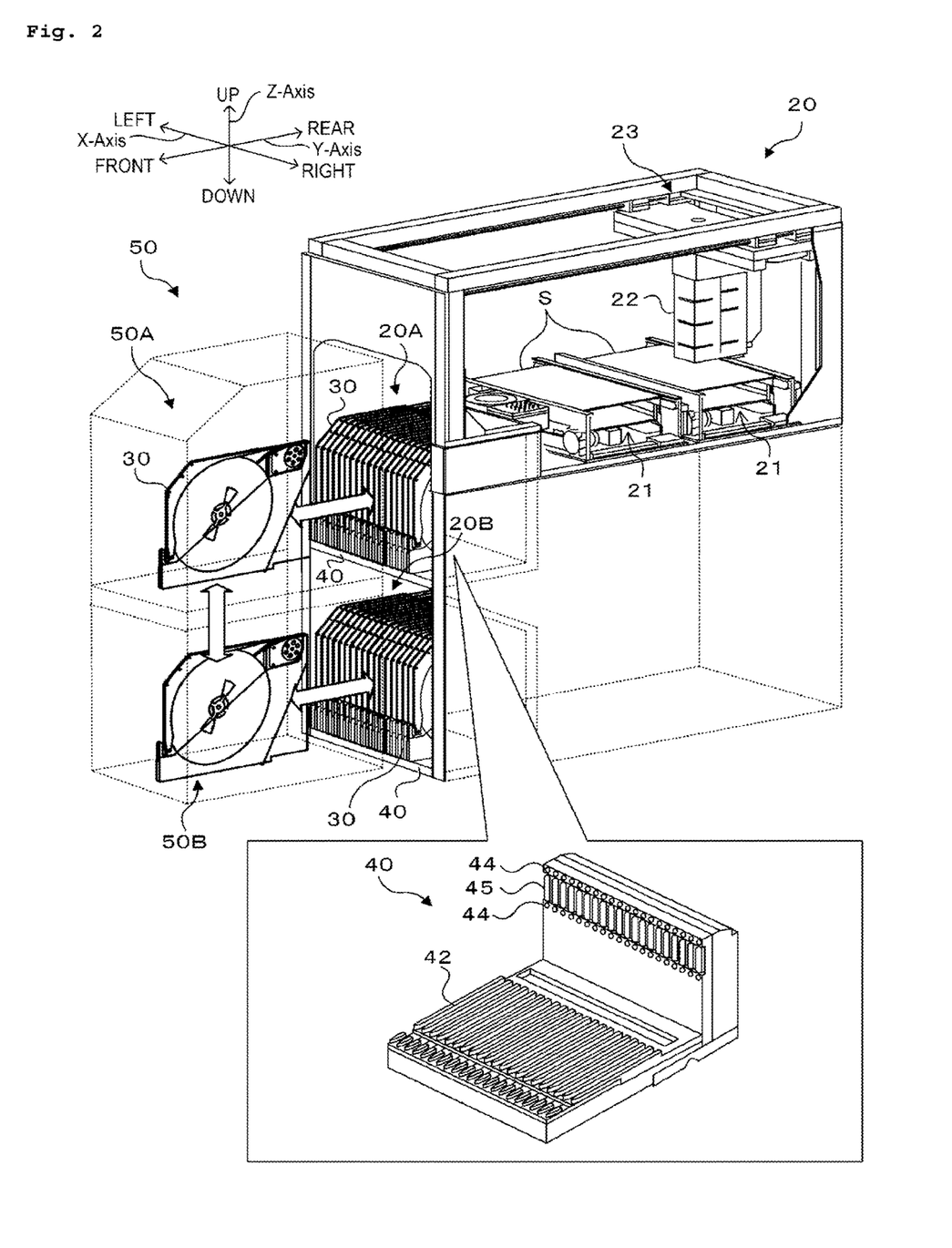
FIG. 2 is a configuration view illustrating an outline of a configuration of component mounter 20.
Figure 3:
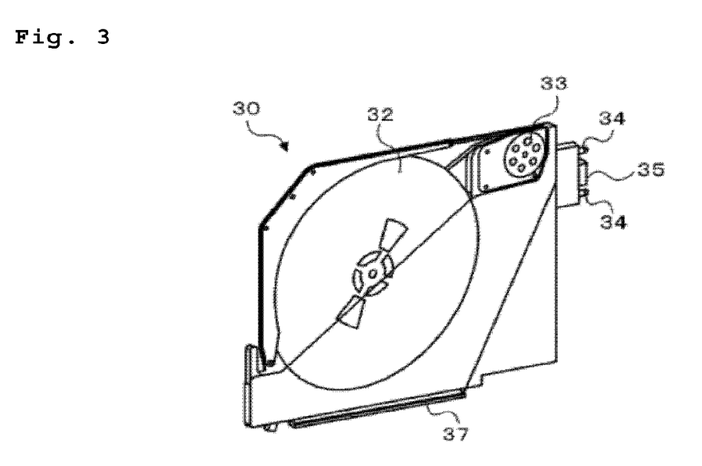
FIG. 3 is a configuration view illustrating an outline of a configuration of feeder 30.
Figure 4:
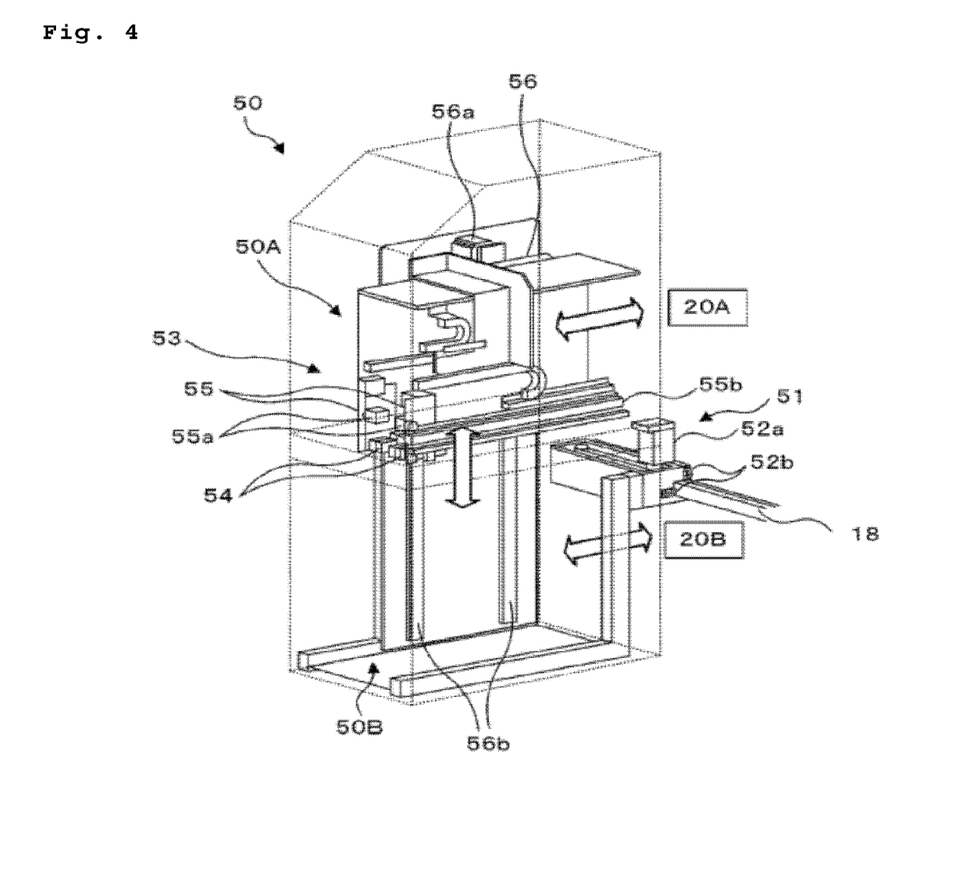
FIG. 4 is a configuration view illustrating an outline of a configuration of loader 50.
Figure 5:
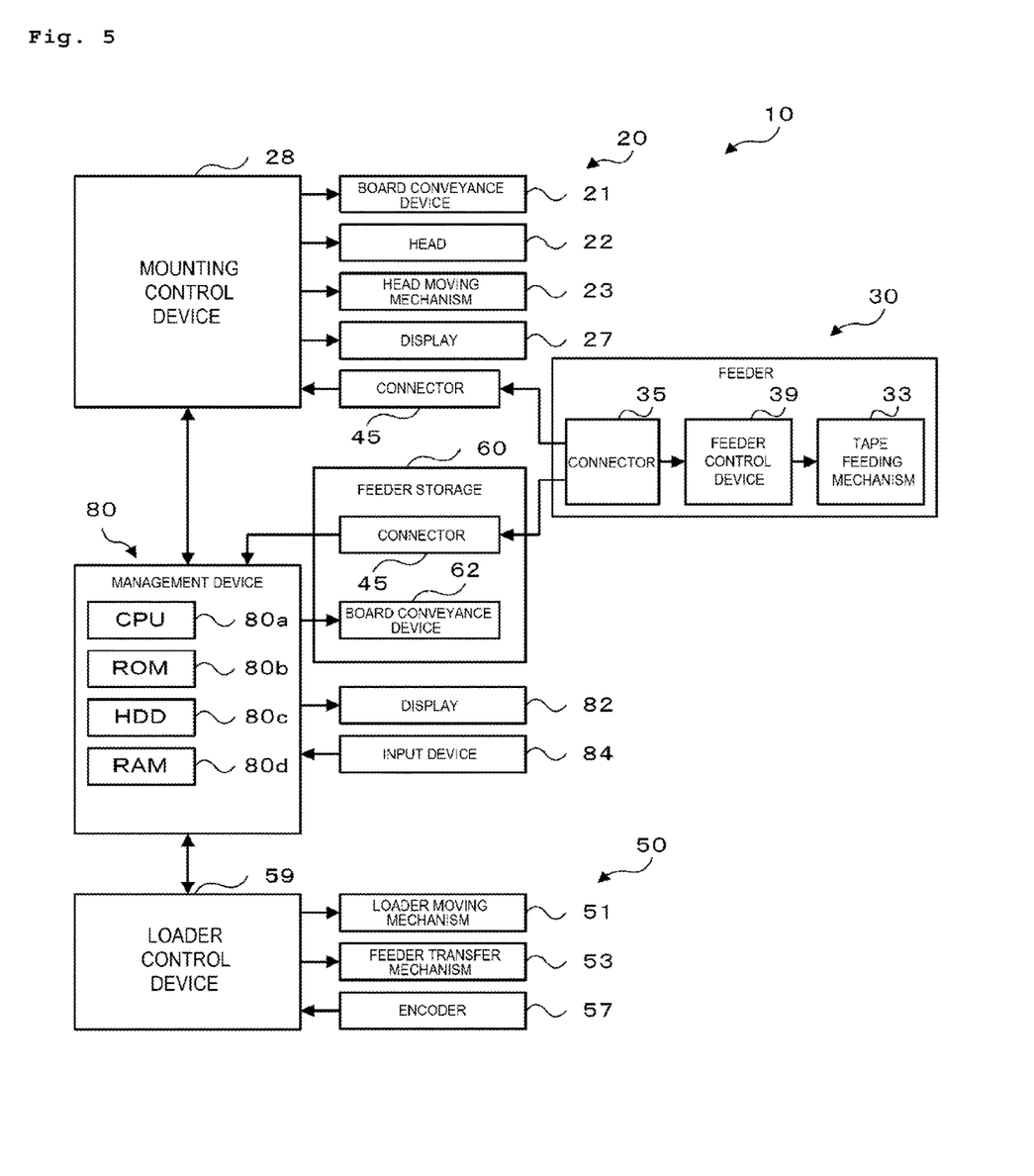
FIG. 5 is a configuration view relating to a control by component mounting system 10.

FIG. 1 is a configuration view illustrating an outline of a configuration of component mounting system 10 in the present embodiment, FIG. 2 is a configuration view illustrating an outline of a configuration of component mounter 20, and FIG. 3 is a configuration view illustrating an outline of a configuration of feeder 30. In addition, FIG. 4 is a configuration view illustrating an outline of a configuration of loader 50, and FIG. 5 is a configuration view relating to a control by component mounting system 10. The lateral direction in FIG. 1 is the X direction, the longitudinal direction is the Y direction, and the vertical direction is the Z direction.

As illustrated in FIG. 1, component mounting system 10 includes printer 12, printing inspector 14, multiple component mounters 20, a mounting inspector (not illustrated), loader 50, in-line storage 60, and management device 80. Printer 12 prints solder on board S. Printing inspector 14 inspects a state of the solder printed by printer 12. Multiple component mounters 20 are installed side by side along the conveyance direction (X direction) of board S, and mount the components supplied from feeder 30 on board S. The mounting inspector inspects a mounting state of the components mounted by component mounter 20. Loader 50 can automatically exchange feeder 30 between multiple component mounters 20, and attaches a required feeder 30 or removes used feeder 30. In-line storage 60 stores feeder 30 scheduled to be used by component mounters 20 and used feeders 30. Management device 80 manages the entire system. Printer 12, printing inspector 14, multiple component mounters 20, and the mounting inspector are arranged side by side in the conveyance direction of board S in this order and form a production line. In-line storage 60 is incorporated in the production line in component mounting system 10, and is installed between the most upstream component mounter 20 in the conveyance direction of board S among multiple component mounters 20 and printing inspector 14. In the present embodiment, an operator replenishes feeder 30 to in-line storage 60, or collects feeder 30 from in-line storage 60. In addition, the operator can also attach or remove feeder 30 to component mounter 20. In addition to these devices, component mounting system 10 may include a reflow device that performs a reflow process of board S on which the components are mounted.

As illustrated in FIG. 2, component mounter 20 includes board conveyance device 21 that conveys board S in the X direction, head 22 that includes suction nozzle for picking up the components supplied by feeder 30, and head moving mechanism 23 that moves head 22 in the XY direction, and display 27 such as an LCD (refer to FIG. 1). In addition, component mounter 20 includes mounting control device 28 (refer to FIG. 5) which is configured with well-known CPU, ROM, RAM, and the like, to control the entire device. Mounting control device 28 outputs a control signal to board conveyance device 21, head 22, head moving mechanism 23, display 27, and the like. In addition, component mounter 20 has two upper and lower areas to which feeder 30 can be attached in the front. The upper area is supply area 20A to which feeder 30 can supply the components, and the lower area is preparation area 20B for preparing or temporarily stocking feeder 30. Supply area 20A and preparation area 20B are provided with feeder base 40 having an L-shaped side view and to which multiple feeders 30 are attached.

As illustrated in FIG. 3, feeder 30 is configured as a tape feeder that sends out a tape that accommodates the components at a predetermined pitch. Feeder 30 includes tape reel 32 in which the tape is wound, tape feeding mechanism 33 that sends out the tape from tape reel 32, connector 35 having two positioning pins 34, rail member 37 provided at the lower end, and feeder control device 39 (refer to FIG. 5). As illustrated in FIG. 2, the feeder base 40 includes multiple slots 42 that are arrayed in the X direction at an interval in which rail member 37 of feeder 30 can be inserted, two positioning holes 44, and connector 45 provided between two positioning holes 44. When rail member 37 of feeder 30 is inserted into slot 42 of feeder base 40, two positioning pins 34 of feeder 30 are inserted into two positioning holes 44, connector 35 and connector 45 are connected to each other. In addition, wide feeder 30 occupying multiple slots 42, narrow feeder 30 having a width that fits in one slot 42, and the like can be attached to feeder base 40. Each feeder base 40 at supply area 20A and preparation area 20B can arrange, for example, approximately 30 or 40 feeders 30 having a predetermined width that fits in each slot 42, respectively. In addition, each feeder base 40 at supply area 20A and preparation area 20B may be able to arrange the same number of feeders 30. Alternatively, each feeder base 40 may be able to arrange a different number of feeders 30, or feeder base 40 at supply area 20A may arrange a larger number of feeders 30 than feeder base 40 at preparation area 20B. The feeder control device 39 is configured with well-known CPU, ROM, RAM, and the like, and outputs a drive signal to tape feeding mechanism 33. In addition, feeder control device 39 can communicate with the control section (mounting control device 28, management device 80, or the like.) to which feeder 30 is attached via the connections of connectors 35 and 45.

As illustrated in FIG. 1, loader 50 can move along X-axis rail 18 provided parallel to the conveyance direction (X direction) of the board on the front of multiple component mounters 20 and the front of in-line storage 60. In FIG. 2, the illustration of X-axis rail 18 is omitted. As illustrated in FIGS. 4 and 5, loader 50 includes loader moving mechanism 51, feeder transfer mechanism 53, encoder 57, and loader control device 59.

Loader moving mechanism 51 moves loader 50 along X-axis rail 18, and includes X-axis motor 52a such as a servomotor that drives a driving belt and guide roller 52b that guides the movement of loader 50 along X-axis rail 18. Feeder transfer mechanism 53 transfers feeder 30 to component mounter 20 or to in-line storage 60. Feeder transfer mechanism 53 includes clamp section 54 that clamps feeder 30 and Y-axis slider 55 in which two clamp sections 54 are arranged, and two clamp sections 54 are integrally moved along Y-axis guide rail 55b in the longitudinal direction (Y direction) by driving Y-axis motor 55a. Feeder transfer mechanism 53 includes two Y-axis sliders 55, total four clamp sections 54 are moved in the Y direction in pairs by arranging two clamp sections 54 in each of two Y-axis sliders 55. Since each clamp section 54 can clamp feeder 30, maximum four feeders 30 can be moved in the Y direction at one time by moving two Y-axis sliders 55 at the same time, and can be attached and detached to and from slot 42 of feeder base 40. As described above, the upper limit number (here, four) of feeders 30 that loader 50 can collectively exchange in one exchange operation is also referred to as a predetermined number N. In addition, feeder transfer mechanism 53 includes Z-axis motor 56a that moves slide base 56 to which clamp section 54 and Y-axis slider 55 are slidably attached, in the vertical direction (Z direction) along Z-axis guide rail 56b. Encoder 57 detects a movement position of loader 50 in the X direction. Loader control device 59 is configured with well-known CPU, ROM, RAM, and the like. Loader control device 59 inputs a detection signal from the encoder 57, and outputs the drive signal to loader moving mechanism 51 (X-axis motor 52a), and feeder transfer mechanism 53 (clamp section 54, Y-axis motor 55a, and Z-axis motor 56a).

When performing the automatic exchange of feeder 30, first, loader control device 59 controls X-axis motor 52a to move loader 50 to slot 42 of component mounter 20 that performs the automatic exchange up to a position of facing Y-axis slider 55 of loader 50. In addition, when performing the automatic exchange between supply area 20A of component mounter 20, loader control device 59 controls Z-axis motor 56a to move slide base 56 (Y-axis slider 55) to upper transfer area 50A facing supply area 20A. On the other hand, when performing the automatic exchange between preparation area 20B of component mounter 20, loader control device 59 controls Z-axis motor 56a to move slide base 56 to lower transfer area 50B facing preparation area 20B. When attaching feeder 30 in loader 50 to component mounter 20, loader control device 59 controls Y-axis motor 55a in a state where feeder 30 is clamped in clamp section 54 to move Y-axis slider 55 to component mounter 20 side (rearward). In this way, rail member 37 of feeder 30 is inserted into slot 42 of feeder base 40. Subsequently, loader control device 59 attaches feeder 30 to feeder base 40 of component mounter 20 by releasing clamp of feeder 30 by clamp section 54. In addition, when removing feeder 30 from component mounter 20 and collecting feeder 30 in loader 50, loader control device 59 controls Y-axis motor 55a to move Y-axis slider 55 to component mounter 20 side (rearward). Subsequently, loader control device 59 clamps feeder 30 attached to feeder base 40 to clamp section 54, and then, controls Y-axis motor 55a to move Y-axis slider 55 forward. In this way, feeder 30 is removed from feeder base 40 and is collected in loader 50.

In order to accommodate multiple feeders 30, in-line storage 60 is provided with feeder base 40 having the same configuration as feeder base 40 provided in component mounter 20. Loader 50 can attach and detach feeder 30 to and from feeder base 40 in in-line storage 60 by the same operation as attaching and detaching feeder 30 to feeder base 40 of component mounter 20. In addition, behind in-line storage 60, board conveyance device 62 for conveying board S in the X direction is provided. Board conveyance device 62 can convey board S received from the board conveyance device of printing inspector 14 and deliver board S to board conveyance device 21 of adjacent component mounter 20.

Figure 6:
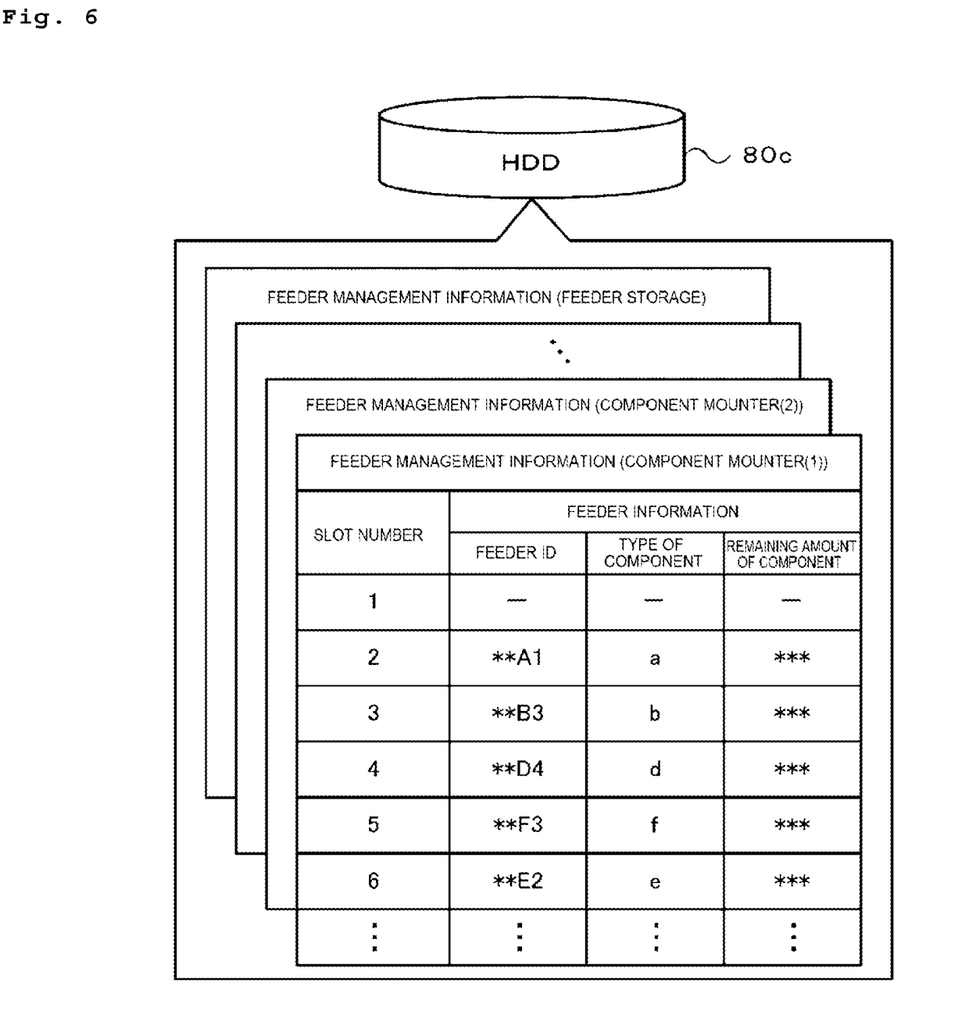
FIG. 6 is an explanatory diagram illustrating an example of feeder management information.

As illustrated in FIG. 5, management device 80 is configured with well-known CPU 80a, ROM 80b, HDD 80c, RAM 80d, and the like, and includes display 82 such as an LCD and input device 84 such as a keyboard and a mouse. Management device 80 stores jobs of board S, feeder management information, and the like. In the jobs, information relating to the mounting process is defined, such as which type of which component will be mounted on board S in what order in each component mounter 20, and how many boards S mounted in this manner will be produced. In addition, in the job, arrangement information is defined, which indicates the arrangement of feeders 30 suitable for the mounting process when multiple feeders 30 corresponding to the types of component to be mounted in each component mounter 20 are mounted on feeder base 40 of supply area 20A. The feeder management information is information relating to feeder 30 held by each component mounter 20 and in-line storage 60. FIG. 6 is an explanatory diagram illustrating an example of the feeder management information. As illustrated in FIG. 6, the feeder management information includes a slot number (position information) of feeder base 40 to which each feeder 30 is mounted, a feeder ID (identification information) of feeder 30 mounted to each slot 42, and the type of component held by each feeder 30, a remaining amount of the component, and the like. Each mounting control device 28 similarly manages its own feeder management information.

In addition, management device 80 is communicably connected to mounting control device 28 by wire and communicably connected to loader control device 59 wirelessly, and is also communicably connected to each control device such as printer 12, printing inspector 14, and mounting inspector. Management device 80 receives information relating to a mounting situation of component mounter 20 and attached and detached feeder 30 from mounting control device 28, and receives information relating to a driving situation of loader 50 from loader control device 59. When the information relating to feeder 30 attached to feeder base 40 of component mounter 20 and feeder 30 removed from feeder base 40 is received from mounting control device 28, management device 80 updates the feeder management information of component mounter 20. In addition, management device 80 outputs a drive signal to board conveyance device 62 of in-line storage 60 and causes board conveyance device 62 to convey board S. In addition, management device 80 is communicably connected to feeder control device 39 of feeder 30 attached to feeder base 40 of in-line storage 60 via connectors 35 and 45, and can acquire the information on feeder 30. When the information relating to feeder 30 attached to feeder base 40 of in-line storage 60 and feeder 30 removed from feeder base 40 is acquired, management device 80 updates the feeder management information in in-line storage 60.

Figure 7:
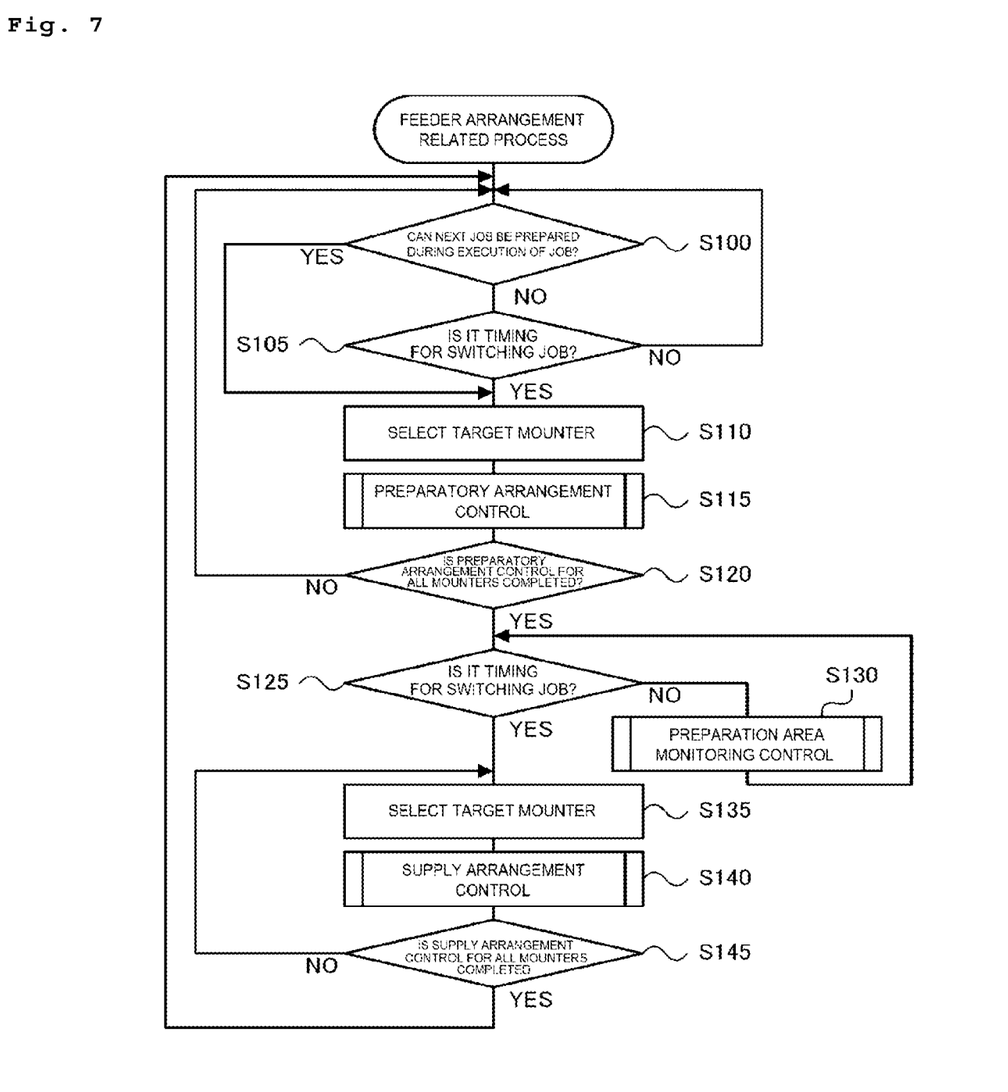
FIG. 7 is a flowchart illustrating an example of a feeder arrangement related process.

The operation of component mounting system 10 configured in this manner, particularly the operation for causing loader 50 to automatically exchange feeder 30 will be described. FIG. 7 is a flowchart illustrating an example of the feeder arrangement related process. This process is executed by CPU 80a of management device 80. In the feeder arrangement related process, first, CPU 80a determines whether it is an allowable timing for preparing feeder 30 required for the next job during the execution of the mounting process based on the job (S100). For example, if loader 50 does not need to automatically exchange feeder 30 because the component shortage does not occur in feeder 30 used for the currently executed job, and there is no possibility that the component shortage will occur for the time being, CPU 80a determines that it is a timing to prepare feeder 30. When it is determined as such, CPU 80a selects target component mounter 20 from multiple component mounters 20 (S110), and executes a preparatory arrangement control that controls loader 50 so that feeder 30 required for the next job is arranged in preparation area 20B of target component mounter 20 (S115). When the preparatory arrangement control is executed in S115, CPU 80a determines whether the preparatory arrangement control for all component mounters 20 is completed (S120), and if it is determined to be completed, the process returns to S100 and if it is determined not to be completed, the process proceeds to S125. Therefore, feeder 30 required for the next job can be sequentially arranged in preparation area 20B of each component mounter 20 during the execution of the mounting process based on the job.

In addition, If it is determined in S100 that it is not the timing when feeder 30 can be prepared, CPU 80a determines whether it is a timing for switching the job (S105), and if it is determined that it is not the timing for switching, the process returns to S100. In addition, if it is determined that it is the timing for switching the job by CPU 80a, since it becomes the timing for switching the job without determining the completion of the preparatory arrangement control of all component mounter 20 in S120, it can be said that there is component mounter 20 for which the preparatory arrangement control has not been performed yet. Therefore, CPU 80a selects target component mounter 20 in S110 and S115 and executes the preparatory arrangement control. That is, if the preparatory arrangement control for all component mounter 20 is not completed during the execution of the mounting process based on the job, CPU 80a executes the preparatory arrangement control when the job is switched.

Figure 8:
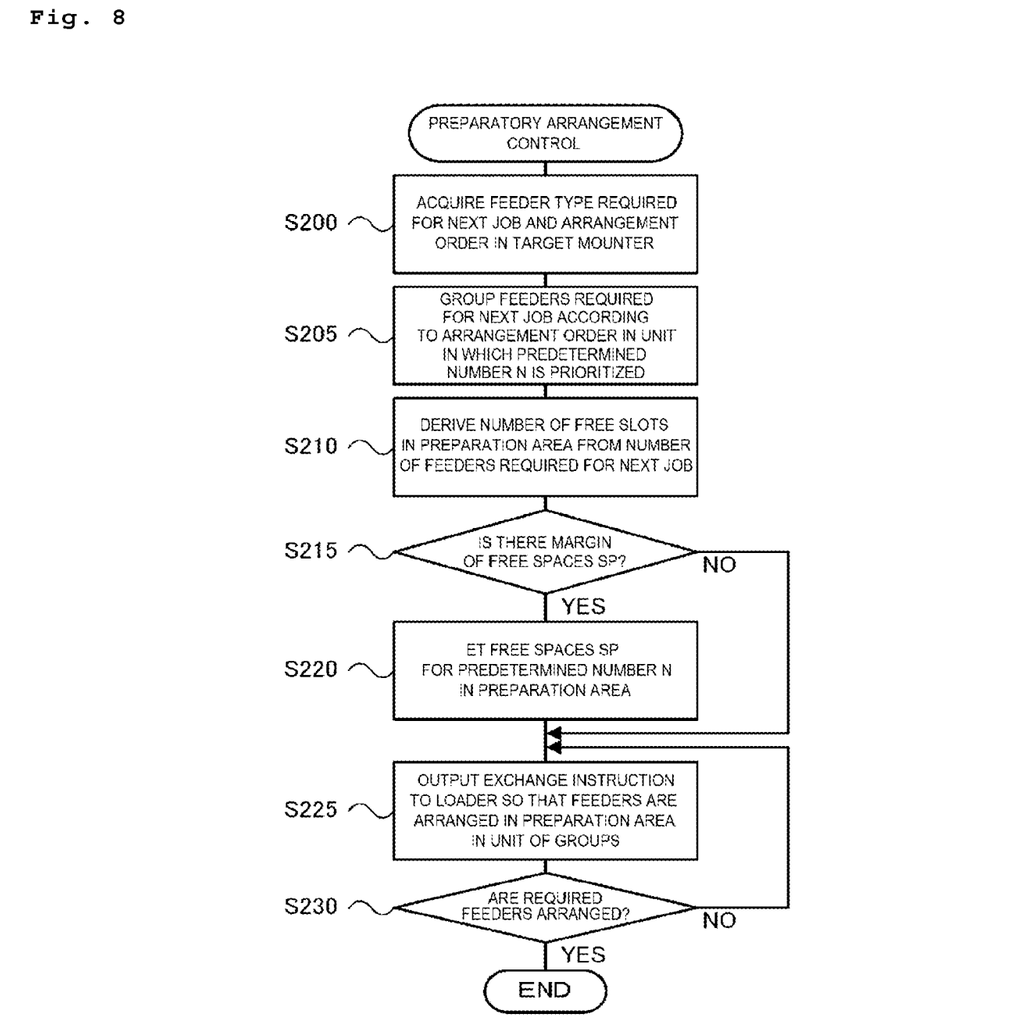
FIG. 8 is a flowchart illustrating an example of a preparatory arrangement control.

The preparatory arrangement control in S115 is executed based on the flowchart in FIG. 8. In this preparatory arrangement control, CPU 80a acquires feeder 30 (feeder type) of the type of component required for the next job and the arrangement order of feeder 30 in supply area 20A in target component mounter 20 selected in S110 (S200). Next, CPU 80a groups feeders 30 required for the next job according to the arrangement order acquired in S205 in a unit in which a the predetermined number N is prioritized (S205). As described above, the predetermined number N is an upper limit number of feeders 30 which can be automatically exchanged by loader 50 in one exchange operation, and is a value 4 in the present embodiment.

Figure 9:
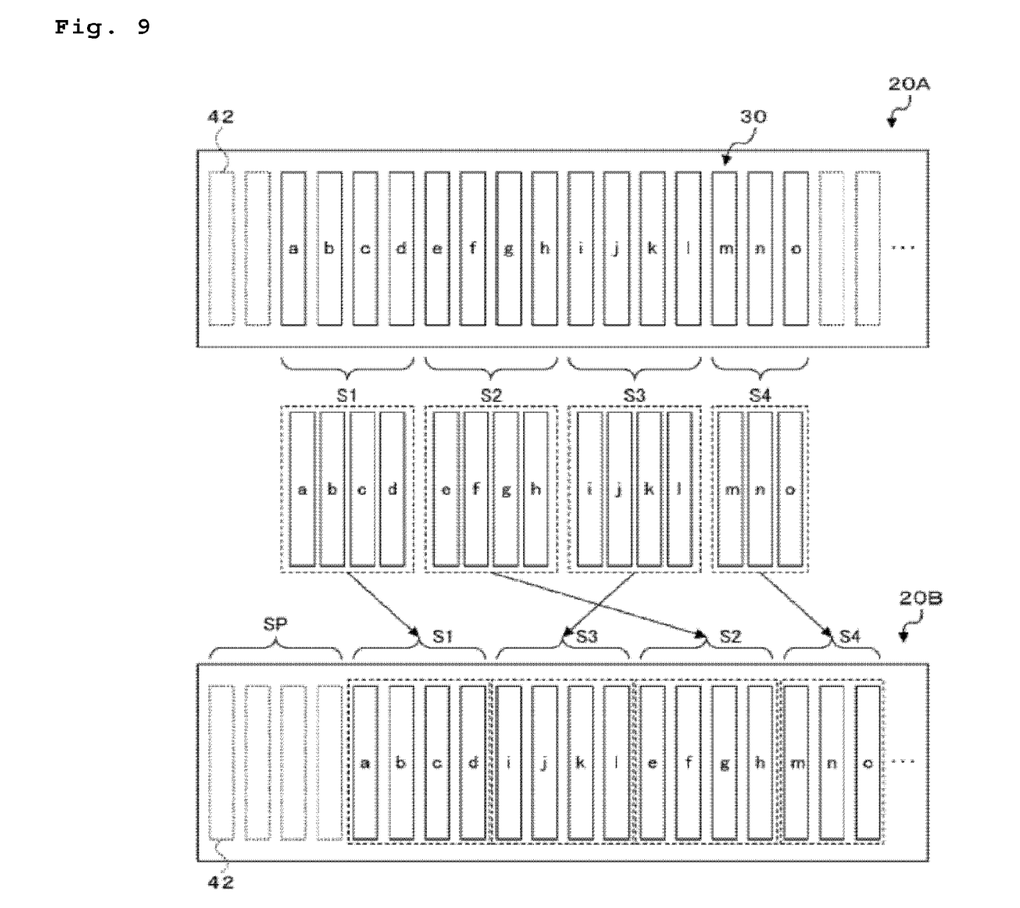
FIG. 9 is an explanatory diagram illustrating an example of grouping feeders 30.

Here, FIG. 9 is an explanatory diagram illustrating an example of grouping feeders 30. FIG. 9 illustrates a case in which 15 types of feeder 30 (15 feeders) for multiple types of components "a" to "o" are arranged in this order as feeder 30 required for the job in supply area 20A of one component mounter 20. In this example, in supply area 20A, feeders 30 are arranged in the order of types of component "a" to "o" from the third slot while leaving two slots 42 on the left end free (indicated by dotted lines). In addition, CPU 80a performs grouping of feeders 30 in S205 in a unit in which value 4 which is the predetermined number N is prioritized. For example, CPU 80a performs grouping from one end of the arrangement order (here, the left end) in the unit of the predetermined number N, and performs grouping with allowing a number less than the predetermined number N for the last group. Therefore, as illustrated in the middle of FIG. 9, CPU 80a divides 15 types of feeder 30 into 4 groups: group S1 for types of component "a" to "d", group S2 for types of component "e" to "h", group S3 for types of component "i" to "I", and group S4 for types of component "m" to "o". That is, CPU 80a performs the grouping into multiple groups (S1 to S3) having feeders 30 of the predetermined number N and one group (S4) having feeders 30 less than the predetermined number N.

When feeders 30 are grouped in this way, CPU 80a derives the number of free slots in preparation area 20B from the number of feeders required for the next job (S210), and determines whether there is a margin in the preparation area 20B for the predetermined number N of collective free spaces SP (S215). In these processes, after all feeders 30 required for the next job are arranged in preparation area 20B, whether the predetermined number N of collective free slots can be secured or not is determined. The number of slots 42 occupied by feeder 30 differs depending on the width of feeder 30, and there are many cases such as one feeder 30 occupies one slot, two feeders 30 occupy 3 slots, and one feeder 30 occupies 2 slots. Therefore, the processes in S210 and S215 are performed while taking the width of each feeder 30 required for the next job, the number of feeders 30, the number of slots 42 in preparation area 20B, the maximum number of feeders 30 arranged according to each width, and the like into consideration.

If it is determined in S215 that there is a margin for free space SP, CPU 80a sets free spaces SP for the predetermined number N in preparation area 20B (S220), and if it is determined in S215 that there is no margin for free space SP, the process in S220 is skipped. Subsequently, CPU 80a outputs an exchange instruction to loader 50 so that feeders 30 are arranged in preparation area 20B in a unit of group (S225), and the process in S225 is repeated until it is determined that the required feeders 30 are arranged (S230). Loader control device 59 outputs a drive signal to loader moving mechanism 51 and feeder transfer mechanism 53 of loader 50 based on the instruction from CPU 80a to perform the automatic exchange of feeder 30. Then, when it is determined in S230 that the required feeders 30 are arranged, the CPU 80a ends the preparatory arrangement control.

FIG. 9 illustrates a case in which there is a margin for free space SP in preparation area 20B, and feeders 30 are arranged while free space SP is provided at the left end of preparation area 20B. Free space SP may be provided at a position other than the left end. In addition, not limited to a case providing free space SP in advance, feeders 30 may be arranged such that an unnecessarily free slot may not occur, and free space SP may be secured from remaining slot 42 in which feeders 30 are not arranged. Here, the arrangement in each group S1 to S4 in preparation area 20B matches the arrangement order of supply areas 20A. However, since the groups are arranged in the order of groups S1, S3, S2, and S4 from the left side, it is different from the arrangement order of the supply area 20A as a whole. In this way, the arrangement of feeders 30 in each group S is assumed to match the arrangement order of feeders 30 in supply area 20A, but the arrangement order of feeders 30 in each group S is not restricted.

After the preparatory arrangement control is executed as described above, and if it is determined in S120 in FIG. 7 that the preparatory arrangement control of all component mounters 20 is completed, CPU 80a determines whether it is the timing for switching the job (S125). If it is determined that it is not the timing for switching the job, CPU 80a executes a preparation area monitoring control (S130) for monitoring the attachment and detachment of feeder 30 to and from preparation area 20B performed by the operator, and the process returns to S125.

Figure 10:
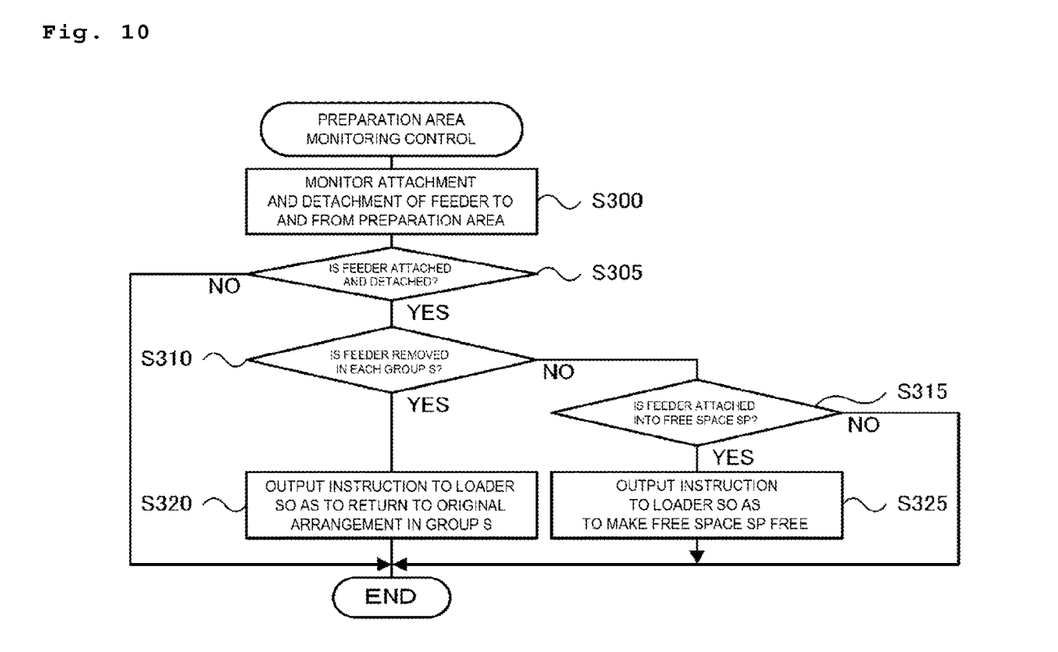
FIG. 10 is a flowchart illustrating an example of a preparation area monitoring control.

The preparation area monitoring control in S130 is executed based on the flowchart in FIG. 10. In this preparation area monitoring control, CPU 80a monitors the attachment and detachment of feeder 30 to and from preparation area 20B of each component mounter 20 (S300), and determines whether feeder 30 is attached and detached (S305). If it is determined in S305 that feeder 30 is not attached and detached, CPU 80a ends the preparation area monitoring control. On the other hand, if it is determined in S305 that feeder 30 is attached or detached, CPU 80a respectively determines whether feeder 30 is removed in each group S (S310) or feeder 30 is attached into the free space SP (S315). If it is determined in S310 that feeder 30 is removed in each group S, CPU 80a outputs the automatic exchange instruction to loader 50 so as to return to the original arrangement in group S (S320), and then, ends the preparation area monitoring control. In S320, for example, CPU 80a searches for another slot 42 to which feeder 30 removed from any one of group S in preparation area 20B is attached. Then, CPU 80a removes feeder 30 from searched slot 42, and outputs an instruction to loader 50 to attach feeder 30 to original slot 42 in original group S. Therefore, even in a case where operator removes feeder 30 in preparation area 20B arranged in a unit of group without being instructed and attaches the feeder 30 to another slot 42, the original arrangement can be appropriately restored.

On the other hand, when it is determined in S315 that feeder 30 is attached to free space SP, CPU 80a outputs an automatic exchange instruction to loader 50 so as to make free space SP free (S325), and then, ends the preparation area monitoring control. In S325, CPU 80*a* searches for a free slot from, for example, preparation area 20B or supply area 20A, removes feeder 30 attached in free space SP, and outputs an instruction to loader 50 to attach the feeder 30 to the searched free slot. Therefore, even when the operator attaches feeder 30 in free space SP, original free space SP can be secured. In addition, if it is determined that both S310 and S315 are negative, although the attachment and detachment of feeder 30 is performed in preparation area 20B, CPU 80*a* determines that there is no change in feeders 30 and the free space SP in each group S arranged by the preparatory arrangement control, and ends the preparation area monitoring control.

CPU 80*a* repeats the preparation area monitoring control until it is determined that it is timing for switching the job in S125 in FIG. 7. Therefore, CPU 80*a* can promptly respond when the arrangement of feeder 30 in preparation area 20B is changed. In FIG. 7, CPU 80*a* performs the preparation area monitoring control after the preparatory arrangement control of all component mounters 20 is completed, but if there is component mounter 20 for which the preparatory arrangement control is completed, the preparation area monitoring control for that component mounter 20 may be started. Then, when CPU 80*a* determines that it is timing for switching the job in S125, CPU 80*a* selects target component mounter 20 from multiple component mounters 20 (S135). Subsequently, the CPU 80*a* execute a supply arrangement control (S140) for arranging feeder 30 required for the job after switching in supply area 20A by causing loader 50 to automatically exchange feeder 30 between supply area 20A and preparation area 20B of target component mounter 20. When the supply arrangement control in S140 is executed, CPU 80*a* determines whether the supply arrangement control for all component mounters 20 is completed (S145), and the process returns to S135 if it is determined not to be completed, and returns to S100 if it is determined to be completed. In S135, CPU 80*a* is selected as the target in an order from, for example, upstream component mounter 20. Since the mounting process is performed while conveying board S from the upstream side to the downstream side, multiple component mounter 20 end the mounting process for last board S in the job before switching in an order from upstream component mounter 20. Therefore, by selecting the target in an order from upstream component mounter 20, it is possible to promptly start the supply arrangement control for component mounter 20 that the mounting process for last board S has ended. In any component mounter 20, when the mounting process for last board S in the job before switching ends, CPU 80*a* may determine that it is timing for switching the job in S125.

Figure 11:
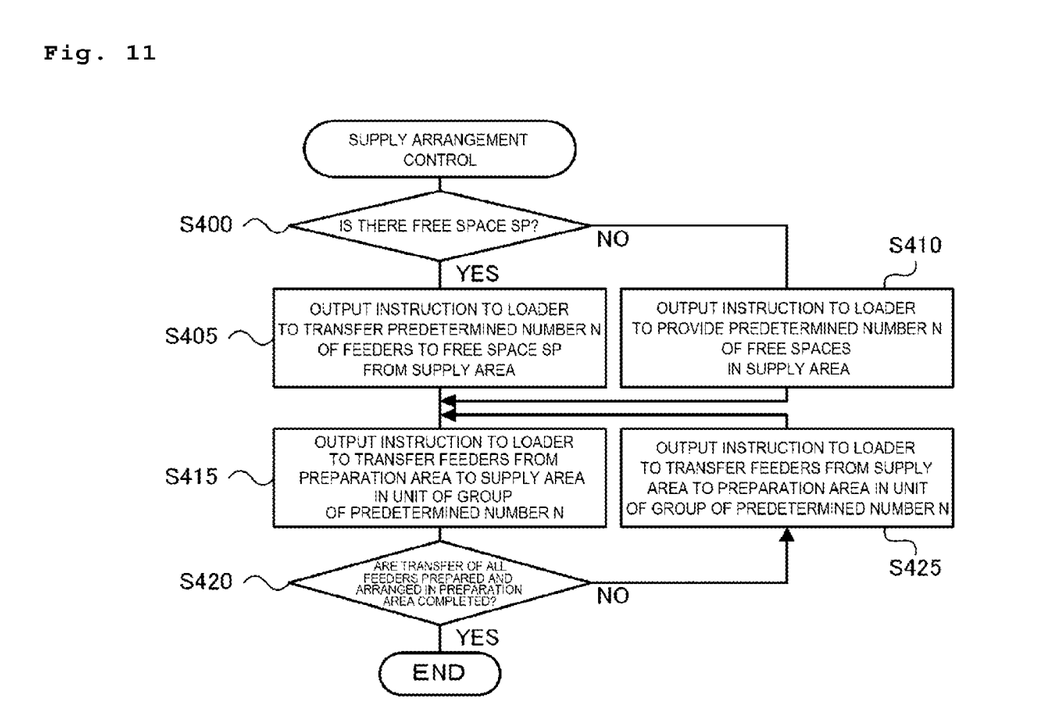
FIG. 11 is a flowchart illustrating an example of a supply arrangement control.
Figure 12A:
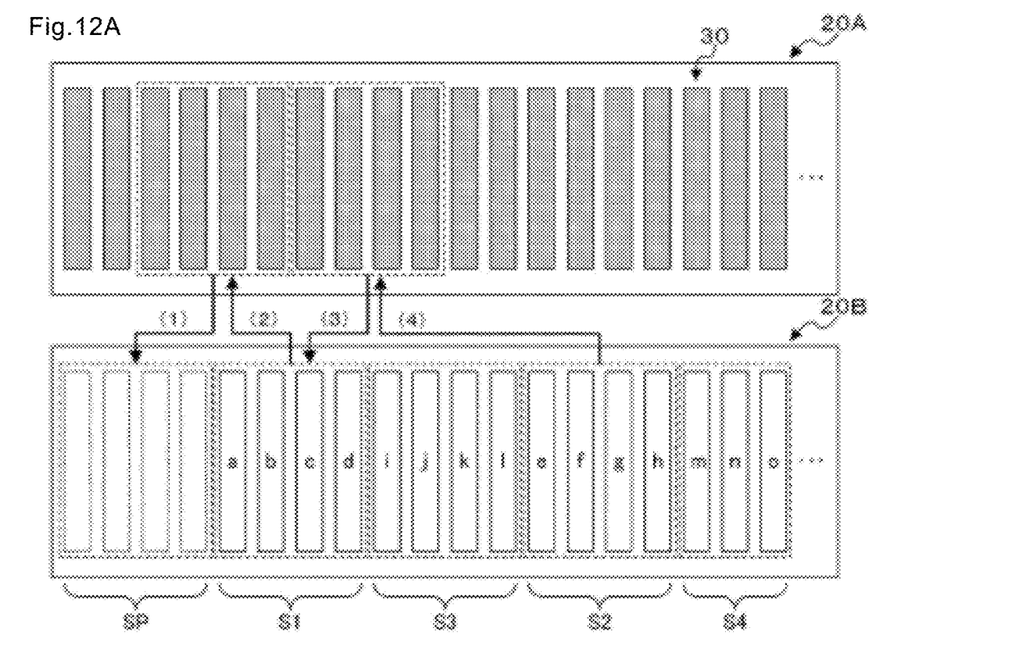
FIG. 12 is an explanatory diagram illustrating an example of an aspect of the supply arrangement control.

The supply arrangement control in S140 is executed based on the flowchart in FIG. 11. In addition, FIG. 12 is an explanatory diagram illustrating an example of an aspect of the supply arrangement control. (1) to (8) in FIG. 12 indicate an order in which feeders 30 are collectively transferred (exchanged) in a unit of group. In the supply arrangement control, CPU 80*a* determines whether there is free space SP in preparation area 20B of target component mounter 20 (S400). If it determined that there is free space SP, CPU 80*a* outputs an instruction to loader 50 to collectively transfer the predetermined number N of feeders 30 to free space SP in preparation area 20B from supply area 20A (S405, (1) in FIG. 12A). For example, in (1) in FIG. 12A, the predetermined number N of slots 42 in supply area 20A to which feeders 30 of group S1 in preparation area 20B is arranged is selected, an instruction is output to loader 50 to collec-
tively transfer the predetermined number N of feeders 30 arranged in slot 42 to free space SP. On the other hand, if it is determined that there is no free space SP in preparation area 20B, CPU 80*a* outputs an instruction to loader 50 to provide free space for the predetermined number N in supply area 20A (S410). CPU 80*a* selects the predetermined number N of slots 42 in supply area 20A similarly to S405, for example, and outputs an instruction to loader 50 to transfer the predetermined number N of feeders 30 arranged in that slot 42. In addition, if there is predetermined number of N of free slots in supply area 20A, CPU 80*a* designates that slot as a transfer destination of feeder 30, and if there is no free slot in supply area 20A, designates the free slot in in-line storage 60 as the transfer destination of feeder 30. Alternatively, when the free slot for predetermined number of N is created by aggregating free slots in supply area 20A, CPU 80*a* may output the instruction to perform aggregation first and to collectively transfer the predetermined number N of feeders 30.

Figure 12B:
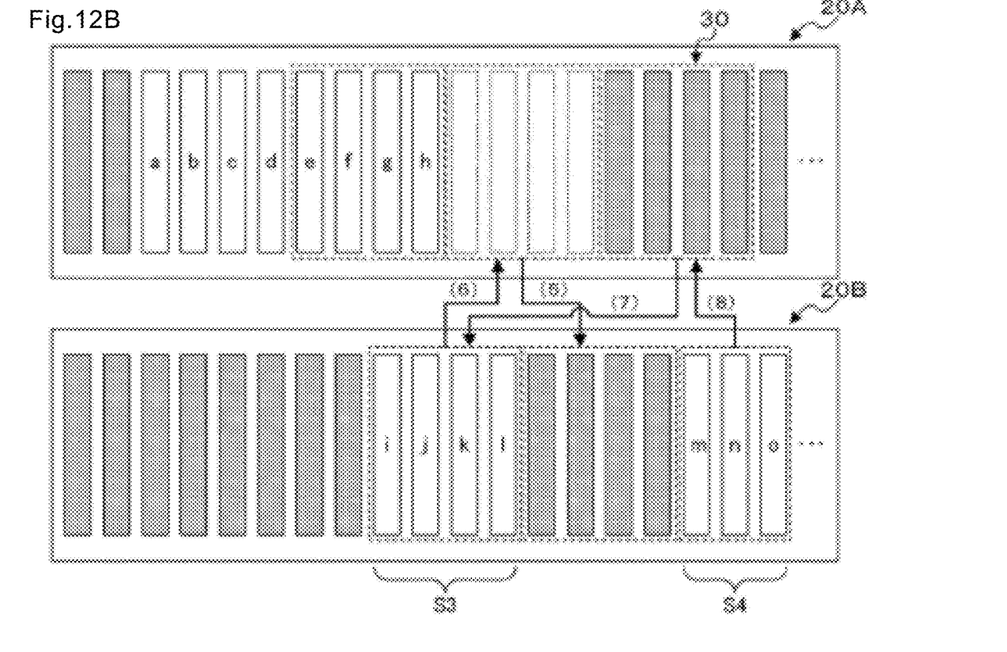

Subsequently, the CPU 80*a* outputs an instruction to loader 50 to collectively transfer feeders 30 from preparation area 20B to a place in supply area 20A that become free by the transfer in S405 or S410 in a unit of group with a priority of the predetermined number N (S415, (2) in FIG. 12A). Next, CPU 80*a* determines whether the transfer of all feeders 30 prepared and arranged in preparation area 20B are completed (S420). Then, if it is determined that the transfer of feeders 30 are not completed, CPU 80*a* outputs an instruction to loader 50 to collectively transfer feeders 30 from supply area 20A to the place in preparation area 20B that becomes free by the transfer in S415 in a unit of group with a priority of the predetermined number N (S425, (3) in FIG. 12A). On the other hand, when CPU 80*a* determines that the transfer of feeders 30 is completed, CPU 80*a* ends the supply arrangement control. In FIG. 12, (4) in FIG. 12A, (6) and (8) in FIG. 12B correspond to S415, and (5) and (7) in FIG. 12B correspond to S425. Four feeders 30 are transferred in (7), but three feeders 30 may be transferred. When transferring feeders 30 from preparation area 20B to supply area 20A, CPU 80*a* outputs an instruction to loader 50 so that feeder 30 in the unit of group is arranged at a place that matches the arrangement order in supply area 20A. In this way, in the preparatory arrangement control, even if group S of feeders 30 is arranged in preparation area 20B in the order different from the arrangement order in supply area 20A, the arrangement in supply area 20A can be performed in an appropriate order. In addition, since feeders 30 are automatically exchanged in a unit with a priority of the predetermined number N which is the upper limit of one exchange operation, the number of exchange operations of loader 50 in the supply arrangement control can be reduced. Therefore, at the time of switching the job, the automatic exchange of feeder 30 can be efficiently performed and the exchange time can be shortened. In the examples in FIGS. 9 and 12, when feeders 30 are exchanged one by one, a maximum of 30 exchange operations are required, however, by performing the collective exchange in the unit of four, since eight exchange operations are sufficient, in calculation, the exchange time can be suppressed to approximately ¼ to ⅓. As a result, the time required for set-up change for switching the job can be shortened, and it is possible to promptly start the mounting process based on the next job.

Here, the correspondence relationship between the configuration elements in the present embodiment and the configuration elements in the present disclosure will be clarified. Feeder 30 in the present embodiment corresponds to the component supply unit, component mounter 20 corresponds to the component mounter, supply area 20A corresponds to the supply area, preparation area 20B corresponds to the preparation area, loader 50 corresponds to the unit exchange device, and management device 80 and loader control device 59 that execute the feeder arrangement related process in FIG. 7 (preparatory arrangement control in FIG. 8 and supply arrangement control in FIG. 11) correspond to a control device.

Component mounting system 10 described above divides feeders 30 required for a job into multiple groups in the unit with a priority of the predetermined number N, and performs the preparatory arrangement control to make the arrangement of feeders 30 in each group S matches the arrangement order in supply area 20A, and to collectively arrange feeders 30 in preparation area 20B for each group S. In addition, at the time of switching the job, the supply arrangement control is performed, in which feeder 30 arranged in preparation area 20B by the preparatory arrangement control and feeder 30 already arranged in supply area 20A are automatically exchanged in a unit with a priority of the predetermined number N. Since the predetermined number N is the upper limit of one exchange operation by loader 50, feeder 30 can be efficiently and automatically exchanged between preparation area 20B and supply area 20A, and it is possible to shorten the exchange time.

In addition, since the preparatory arrangement control of feeder 30 required for the job after switching is performed during the execution of the mounting process based on the job before switching, it is possible to promptly start the supply arrangement control at the time of switching the job.

In addition, in the preparatory arrangement control, since free space SP in which a predetermined number N of feeders 30 can be collectively arranged is provided in preparation area 20B, in the supply arrangement control, the automatic exchange of feeders 30 can be started immediately in a unit of the predetermined number N, and thus, it is possible to further shorten the exchange time.

In addition, since the preparation area monitoring control is executed from ending of the preparatory arrangement control to starting of the supply arrangement control, even if feeder 30 in preparation area 20B is attached and detached by the operator, it is possible to return to the original arrangement. Therefore, since the arrangement which is different from that prepared by the preparatory arrangement control can be returned to the original arrangement, it is possible to prevent the start of the supply arrangement control from being delayed.

In addition, since supply area 20A and preparation area 20B are provided vertically in component mounter 20 side by side in that order, when performing the supply arrangement control, loader 50 does not need to significantly move in the arrangement direction (X direction) of component mounter 20, and thus, it is possible to efficiently perform the supply arrangement control.

It goes without saying that the present disclosure is not limited to the embodiment described above, and can be implemented in various aspects as long as it belongs to the technical scope of the present disclosure.

For example, in the embodiment described above, supply area 20A and preparation area 20B are vertically provided in component mounter 20 side by side in this order, but the present disclosure is not limited to this. For example, feeder base 40 at the lower stage of component mounter 20 is not limited to be used as preparation area 20B, but feeder base 40 in in-line storage 60 may be used.

In the embodiment described above, the preparation area monitoring control is executed from ending of the preparatory arrangement control to starting of the supply arrangement control, but the present disclosure is not limited to this. For example, without executing the preparation area monitoring control, it may be confirmed whether there is a change in the arrangement of feeders 30 in preparation area 20B when the supply arrangement control is started.

In the embodiment described above, free space SP is provided in the preparatory arrangement control, but it is not limited to this, and free space SP may not be provided in the preparatory arrangement control. In this case, the free space for the predetermined number N may be provided in any one of supply area 20A and preparation area 20B at the time of starting the supply arrangement control. The process of providing the free space in supply area 20A at the time of starting the supply arrangement control is the process in S410 in FIG. 11.

In the embodiment described above, the preparatory arrangement control is executed during the execution of the mounting process based on the previous job, but it is not limited to this, and the preparatory arrangement control may be executed after the previous job ends and at a time when it becomes timing for switching. However, in order to promptly perform the automatic exchange of feeders 30, it is preferable to execute the preparatory arrangement control during the execution of the mounting process based on the previous job.

In the embodiment described above, the value 4 is exemplified as the predetermined number N, but the present disclosure is not limited to this, and the value may be 2 or 3, or may be multiple values of 5 or more.

In the component mounting system in the present disclosure, the control device may perform the preparatory arrangement control for the component supply unit required for the job after switching while mounting the component on the board based on the job before switching. In this way, since the supply arrangement control can be promptly started when switching jobs, it is possible to further shorten the time required for the automatic exchange of the component supply unit.

In the component mounting system in the present disclosure, the control device may control a unit exchange device so as to provide a free space in which at least one set of predetermined number of the component supply units can be collectively arranged before switching jobs, in the supply area or in the preparation area. In this way, in the supply arrangement control, since the automatic exchange of the component supply units can be immediately started in a unit of predetermined number, it is possible to further shorten the time required for automatic exchange of the component supply units.

In the component mounting system in the present disclosure, the control device may monitor the presence or absence of the attachment and detachment of the component supply unit in the preparation area from ending of the preparatory arrangement control to starting of the supply arrangement control, and when the component supply unit is attached or detached, may control the unit exchange device so as to return the arrangement of the component supply unit in the preparation area to the original arrangement. In this way, even if the component supply unit in the preparation area is attached or detached by the operator, since it can be promptly returned the original arrangement, it is possible to prevent the start of the supply arrangement control from being delayed for returning the arrangement.

In the component mounting system in the present disclosure, the supply area and the preparation area may be provided vertically side by side in the component mounter in that order. In this way, when the supply arrangement control is performed, the unit exchange device does not need to significantly move, and thus, it is possible to perform the automatic exchange more efficiently.

INDUSTRIAL APPLICABILITY

The present disclosure can be used in the manufacturing industry of component mounting systems and the like.

REFERENCE SIGNS LIST

10 component mounting system, 12 printer, 14 printing inspector, 18 X-axis rail, 20 component mounter, 20A supply area, 20B preparation area, 21 board conveyance device, 22 head, 23 head moving mechanism, 27 display, 28 mounting control device, 30 feeder, 32 tape reel, 33 tape feeding mechanism, 34 positioning pin, 35 connector, 37 rail member, 39 feeder control device, 40 feeder base, 42 slot, 44 positioning hole, 45 connector, 50 loader, 50A upper transfer area, 50B lower transfer area, 51 loader moving mechanism, 52a X-axis motor, 52b guide roller, 53 feeder transfer mechanism, 54 clamp section, 55 Y-axis slider, 55a Y-axis motor, 55b Y-axis guide rail, 56 slide base, 56a Z-axis motor, 56b Z-axis guide rail, 57 encoder, 59 loader control device, 60 in-line storage, 62 board conveyance device, 80 management device, 80a CPU, 80b ROM, 80c HDD, 80d RAM, 82 display, 84 input device, S board.

The invention claimed is:

1. A component mounting system that includes a component mounter in which multiple component supply units are detachably arranged in a supply area and mounts components on a board based on a job, the system comprising:
 a loader configured to be able to automatically exchange the component supply units with a predetermined number as an upper limit for each exchange operation between the loader and the supply area and between the loader and a preparation area different from the supply area; and
 a control device configured to perform
  a preparatory arrangement control for dividing the component supply units required for the job into multiple groups with a priority of the predetermined number, and controlling the loader so as to make an arrangement of the component supply units in each group match an arrangement order in the supply area and to collectively arrange the component supply units in the preparation area for each group, and
 a supply arrangement control for controlling the loader so as to automatically exchange the component supply units arranged in the preparation area by the preparatory arrangement control and the component supply units already arranged in the supply area before switching the job with the priority of the predetermined number at a time of switching the job, and to arrange the component supply units required for the job after switching in the supply area.

2. The component mounting system according to claim 1, wherein the control device is configured to perform the preparatory arrangement control for the component supply units required for the job after switching while mounting the components on the board based on the job before switching.

3. The component mounting system according to claim 1, wherein the control device is configured to control the loader so as to provide a free space in the supply area or in the preparation area in which at least one group of the predetermined number of the component supply units can be collectively arranged before switching the job.

4. The component mounting system according to claim 1, wherein the control device is configured to monitor a presence or absence of attachment and detachment of the component supply units in the preparation area from ending of the preparatory arrangement control to starting of the supply arrangement control, and when the component supply units are attached and detached, control the loader so as to return the arrangement of the component supply units in the preparation area to an original arrangement.

5. The component mounting system according to claim 1, wherein the supply area and the preparation area are provided vertically side by side in the component mounter.

* * * * *